United States Patent
Ahn et al.

(10) Patent No.: US 7,759,192 B2
(45) Date of Patent: Jul. 20, 2010

(54) SEMICONDUCTOR DEVICE INCLUDING CAPACITOR AND METHOD OF FABRICATING SAME

(75) Inventors: Jae-Young Ahn, Gyeonggi-do (KR); Jin-Tae Noh, Gyeonggi-do (KR); Hee-Seok Kim, Gyeonggi-do (KR); Jin-Gyun Kim, Gyeonggi-do (KR); Ju-Wan Lim, Seoul (KR); Sang-Ryol Yang, Gyeonggi-do (KR); Hong-Suk Kim, Gyeonggi-do (KR); Sung-Hae Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 846 days.

(21) Appl. No.: 11/258,619

(22) Filed: Oct. 24, 2005

(65) Prior Publication Data

US 2006/0097299 A1 May 11, 2006

(30) Foreign Application Priority Data

Oct. 22, 2004 (KR) ........................ 10-2004-0084867

(51) Int. Cl.
*H01L 21/8242* (2006.01)
(52) U.S. Cl. ................. 438/253; 257/308; 257/E21.011
(58) Field of Classification Search ................. 257/295, 257/E21, E21.011; 438/253
See application file for complete search history.

(56) References Cited

U.S. PATENT DOCUMENTS

| 5,130,885 | A  | * | 7/1992  | Fazan et al. ............... 361/313 |
| 6,121,086 | A  | * | 9/2000  | Kuroda et al. .............. 438/256 |
| 6,436,763 | B1 | * | 8/2002  | Huang et al. ............... 438/255 |
| 6,440,811 | B1 | * | 8/2002  | Coolbaugh et al. .......... 438/324 |
| 6,541,811 | B2 | * | 4/2003  | Thakur et al. ............... 257/303 |
| 6,573,552 | B1 | * | 6/2003  | Thakur ..................... 257/309 |
| 7,153,750 | B2 | * | 12/2006 | Chung et al. ............... 438/393 |
| 2002/0025650 | A1 | * | 2/2002 | Thakur et al. .............. 438/398 |
| 2004/0087100 | A1 | * | 5/2004 | Gousev et al. .............. 438/394 |
| 2005/0017286 | A1 | * | 1/2005 | Yeo et al. .................. 257/310 |
| 2005/0189597 | A1 | * | 9/2005 | Masuoka et al. ............ 257/371 |
| 2006/0060920 | A1 | * | 3/2006 | Paranjpe et al. ............ 257/347 |
| 2006/0134856 | A1 | * | 6/2006 | Cho et al. .................. 438/240 |

FOREIGN PATENT DOCUMENTS

JP      2002-203947      7/2002

OTHER PUBLICATIONS

English language abstract of Korean Publication No. 2002-203947.

* cited by examiner

*Primary Examiner*—Kiesha R Bryant
*Assistant Examiner*—Igwe U Anya
(74) *Attorney, Agent, or Firm*—Volentine & Whitt, PLLC

(57) ABSTRACT

A semiconductor device includes a capacitor having a bottom electrode, a dielectric layer formed on the bottom electrode, a top electrode formed on the dielectric layer, and a contact plug having a metal that is connected with the top electrode, wherein the top electrode includes a doped poly-$Si_{1-x}Ge_x$ layer and a doped polysilicon layer epitaxially deposited on the doped poly-$Si_{1-x}Ge_x$ layer and the contact plug makes a contact with the doped polysilicon layer.

17 Claims, 9 Drawing Sheets

SEMICONDUCTOR DEVICE INCLUDING CAPACITOR AND METHOD OF FABRICATING SAME

CROSS-REFERENCE TO RELATED APPLICATIONS

This application claims foreign priority from Korean (KR) Patent Application No. 10-2004-0084867, filed on 22 Oct. 2004. Korean Patent Application No. 10-2004-0084867 is hereby incorporated by reference.

BACKGROUND

1. Technical Field

This disclosure relates to semiconductor devices that include capacitors and methods of fabricating the same.

2. Description of the Related Art

As the integration scale of semiconductor devices increases, the cell sizes of semiconductor devices such as Dynamic Random Access Memories (DRAMs) decrease. Consequently, the effective area of a lower electrode in a cell capacitor also decreases. However, a certain level of cell capacitance is generally required for proper device operation.

One approach to achieving a high level of cell capacitance within a limited area is the use of high-k dielectric materials, which have dielectric constants that are several times to several hundreds times higher than those materials that are commonly used as a capacitor dielectric layer, such as oxide/nitride/oxide (ONO).

A disadvantage to the above approach is that a doped polysilicon electrode used as a top/bottom electrode of a conventional capacitor typically reacts with the high-k dielectric layer, degrading the electrical characteristics of the capacitor. Thus, a low-k dielectric layer such as a silicon oxynitride (SiON) layer is typically formed between the doped polysilicon electrode and the high-k dielectric layer.

The presence of the additional low-k dielectric layer increases the thickness of the capacitor dielectric layer. Another disadvantage of using the conventional doped polysilicon electrode is that the doped polysilicon layer needs to be formed at above 600° C. to activate dopants of the polysilicon electrode or a specific thermal treatment is often required. This high temperature process increases leakage currents in the capacitor.

As alternatives to using semiconductor-insulator-semiconductor (SIS) capacitors, which implement the top and bottom electrodes using doped polysilicon layers, it has been suggested that metal layers, which have a reactivity that is relatively lower than that of the polysilicon layers, be used. A metal layer may be used as a top electrode in conjunction with a high-k dielectric layer, or a metal layer may be used to implement both the top electrode and the bottom electrode. The former and latter capacitors are known as a metal-insulator-semiconductor (MIS) capacitor and a metal-insulator-metal (MIM) capacitor, respectively.

For MIS capacitors, there may be limitations in integration processes related to wet etching, dry etching, and stress. Also, since the metal layer has a low resistivity, the metal layer may not be adequate to function as a resistor layer for delaying signals.

Regardless of the capacitor type, in order to decrease the capacitor leakage current while simultaneously achieving highly integrated DRAM cells, it is often necessary to perform processes subsequent to formation of the high-k dielectric layer at a low temperature because the thermal stability of the high-k dielectric layer is not very good. Also, when an interconnection process is performed after the capacitor formation process, it is often required to decrease a contact resistance level between the top electrode of the capacitor and a metal contact plug.

Embodiments of the invention address these and other limitations of the conventional art.

SUMMARY

According to some embodiments of the invention, a semiconductor device has a capacitor with an improved leakage current characteristic and a low level of contact resistance between the capacitor and a metal contact plug. According to other embodiments of the invention, a method of fabricating a semiconductor device having a capacitor with an improved leakage current characteristic and a low level of contact resistance between the capacitor and the metal contact plug may be accomplished at a relatively low temperature.

BRIEF DESCRIPTION OF THE DRAWINGS

The above and other features and advantages of the invention are described in detail below with reference to the following figures.

DETAILED DESCRIPTION

Figure 1:
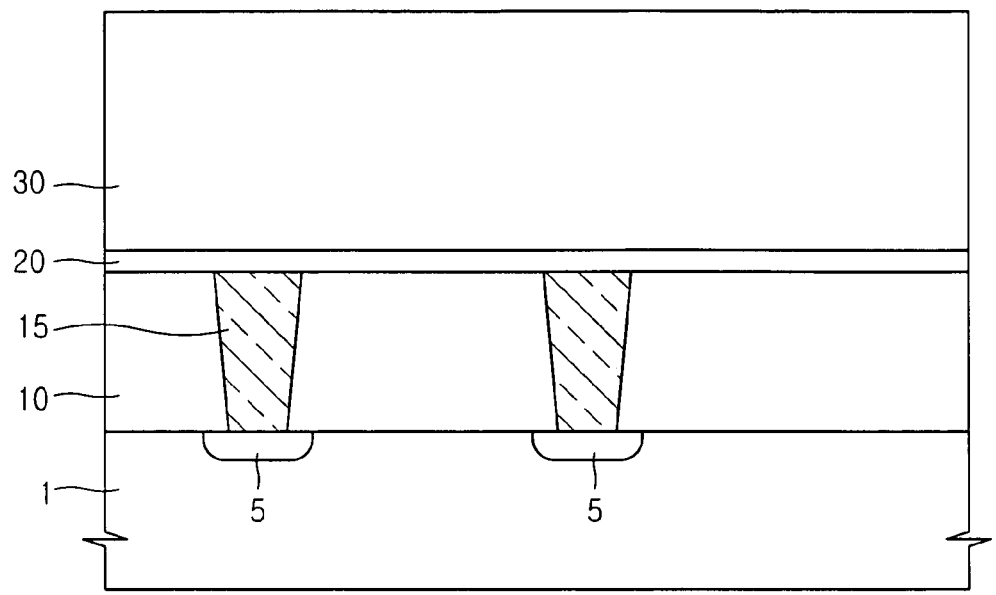
FIGS. 1 through 7 are sectional diagrams illustrating a semiconductor device manufactured according to some embodiments of the invention.

The invention will be described more fully below with reference to the accompanying drawings in which certain embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, some features may be exaggerated for clarity. To facilitate understanding, identical reference numerals have been used, where possible, to designate identical elements that are common to the figures.

FIGS. 1 through 7 are sectional diagrams illustrating a semiconductor device manufactured according to some embodiments of the invention. As will be explained below, the semiconductor device includes a capacitor having a bottom electrode implemented with a doped polysilicon layer and a top electrode implemented with a dual layer structure of a doped poly-$Si_{1-x}Ge_x$ layer and a doped polysilicon layer epitaxially formed on the doped poly-$Si_{1-x}Ge_x$ layer.

Referring to FIG. 1, a bottom insulation layer 10 is formed on a substrate 1. Next, first contact plugs 15 are formed. The first contact plugs 15 pass through the bottom insulation layer 10 to make physical contact with impurity regions 5. An etch stop layer 20 is formed on the first contact plugs 15 and the bottom insulation layer 10, and a mold oxide layer 30 is formed on the etch stop layer 20. The etch stop layer 20 may include a material such as silicon nitride, and the mold oxide layer 30 preferably includes a material selected from a group consisting of boro-phospho-silicate glass (BPSG), phospho-silicate glass (PSG), plasma enhanced-tetraethyl orthosilicate (PE-TEOS), and high density plasma (HDP) oxide.

Figure 2:
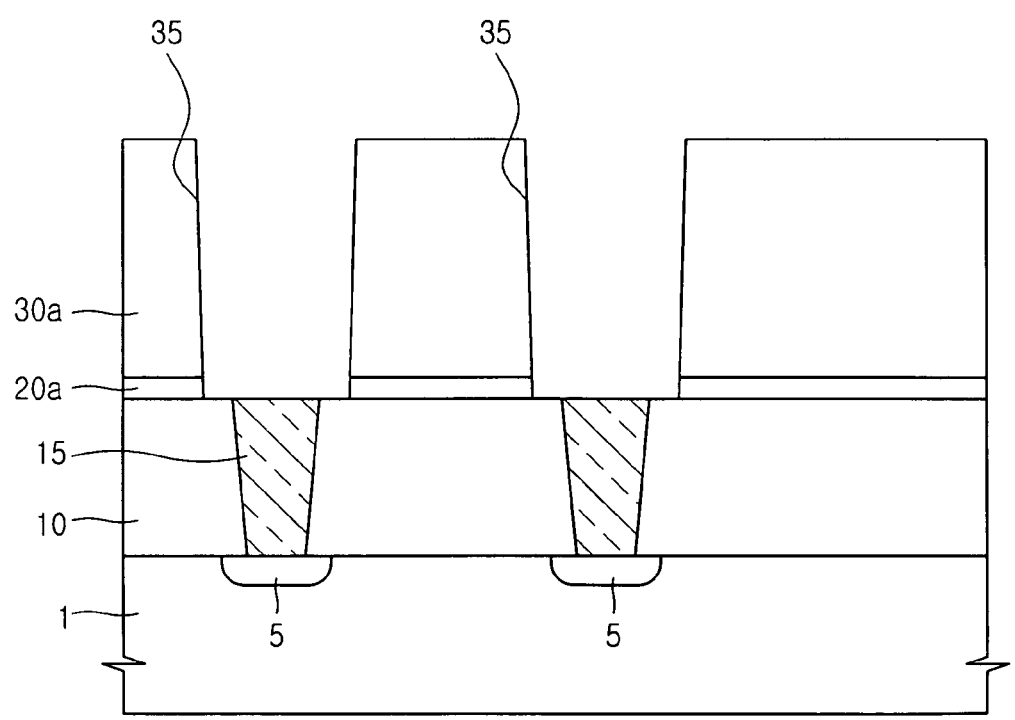

Referring to FIG. 2, the mold oxide layer 30 is etched until a surface of the etch stop layer 20 is exposed, thereby obtaining mold oxide patterns 30A. The etch stop layer 20 protects the bottom insulation layer 10 when the mold oxide layer 30 is etched. Subsequently, another etching process is carried out to remove the exposed etch stop layer 20, thereby forming openings 35. Each of the openings 35 exposes the corresponding first contact plug 15 and upper surfaces of the bottom insulation layer 10 that are adjacent to the corresponding first contact plug 15. A patterned etch stop layer 20a remains underneath each of the mold oxide patterns 30A.

Figure 3:
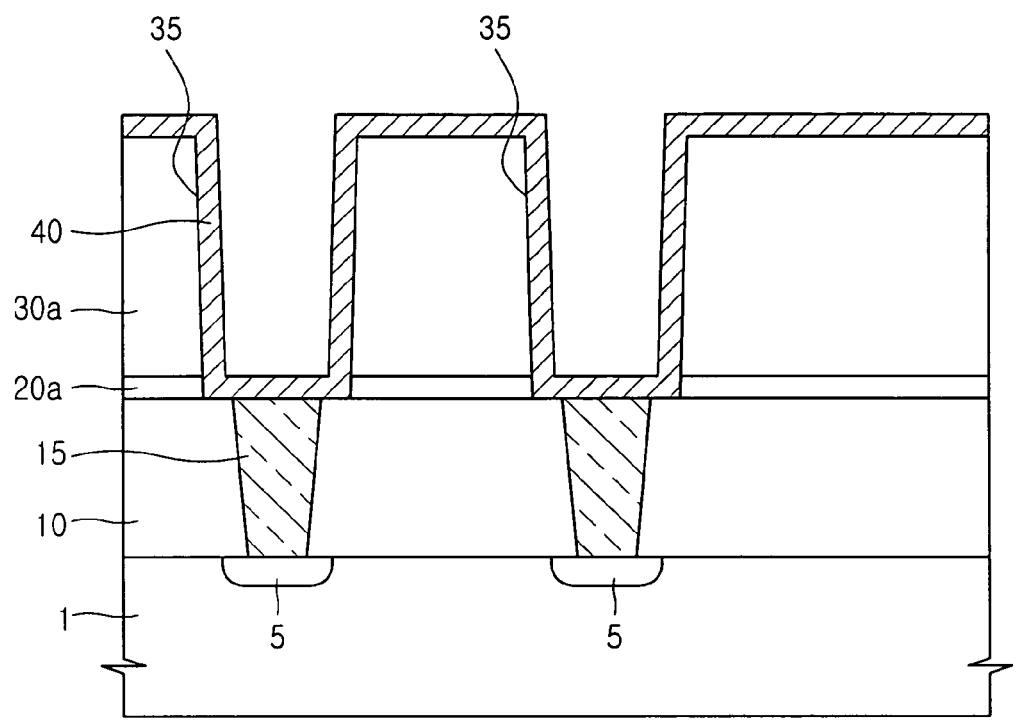

As shown in FIG. 3, a first doped polysilicon layer 40 is formed on exposed surfaces of the mold oxide patterns 30a, the patterned etch stop layer 20a, the bottom insulation layer 10, and the first contact plugs 15. The first doped polysilicon layer 40 is not thick enough to completely fill the openings 35, and will subsequently be used as a bottom electrode of a capacitor. The first doped polysilicon layer 40 may be formed using a chemical vapor deposition (CVD) method that provides a good step coverage characteristic or an atomic layer deposition (ALD) method. For instance, a polysilicon layer may first be formed through a typical low pressure (LP) CVD method, and then, phosphine ($PH_3$) may be doped on the polysilicon layer to secure a certain level of resistivity. The phosphine doping provides an N-type impurity doped polysilicon layer, i.e., the first doped polysilicon layer 40.

Figure 4:
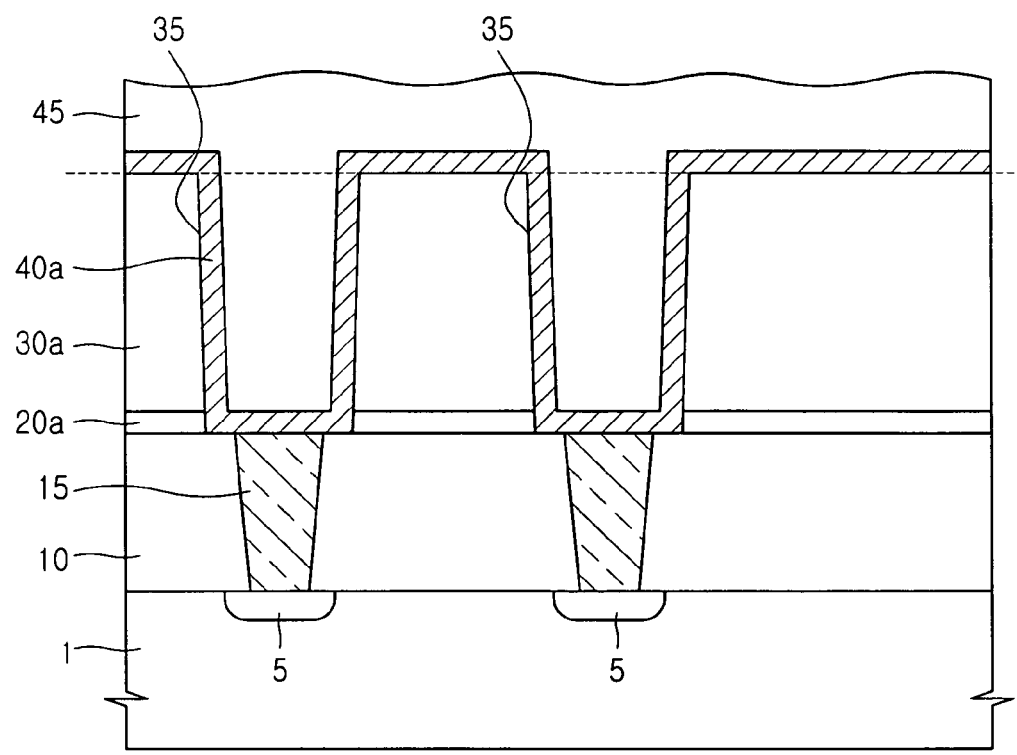

Referring to FIG. 4, a capping layer 45 is formed on the first doped polysilicon layer 40 and fills the openings 35. The capping layer 45 includes a material having a good gap-fill characteristic, for example, a material such as undoped silicate glass (USG). An etch-back process or a chemical mechanical polishing (CMP) process is performed on the capping layer 45 and the first doped polysilicon layer 40 (refer to FIG. 3) until upper surfaces of the mold oxide patterns 30A are exposed. That is, portions of the capping layer 45 and the first doped polysilicon layer 40 disposed above the dotted line in FIG. 4 are removed through the etch-back or CMP process and as a result, isolated cylinder type bottom electrodes 40A are formed.

Figure 5:
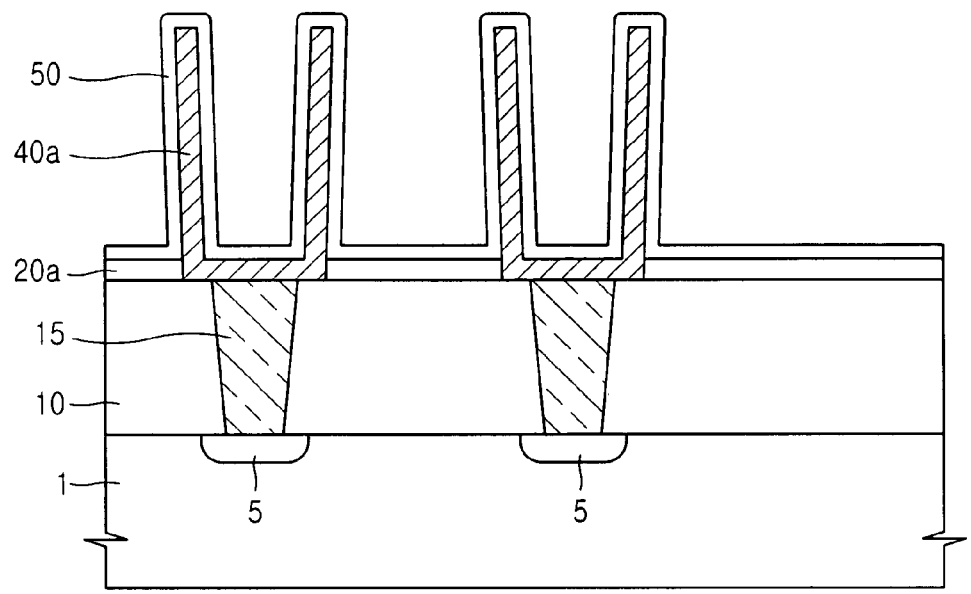

With reference to FIG. 5, a remaining portion of the capping layer 45 and the mold oxide patterns 30A are preferably removed by a wet etching process to expose a bottom surface of the bottom electrodes 40A. A dielectric layer 50 is then formed over the bottom electrodes 40A. Prior to forming the dielectric layer 50, an optional plasma nitridation process using a gas of $NH_3$ or an optional thermal nitridation process may be performed on the bottom electrodes 40A. The plasma nitridation or thermal nitridation process causes formation of a silicon nitride layer on the bottom electrodes 40A. The silicon nitride layer has a thickness ranging from approximately 10 Å to approximately 20 Å and helps to prevent a reaction between the bottom electrodes 40A and the dielectric layer 50.

The dielectric layer 50 may be formed by using a material selected from a group consisting of hafnium oxide ($HfO_2$), aluminum oxide ($Al_2O_3$), and a combination thereof. Also, a CVD method or an ALD method can be employed to form the dielectric layer 50. The ALD method is advantageous because a deposition temperature of the ALD method may be maintained around approximately 300° C. An additional process can be performed after the formation of the dielectric layer 50 to improve the electrical characteristics of the dielectric layer 50. Examples of these additional processes include an ozone ($O_3$) treatment process, a plasma treatment process, and a thermal treatment process. For the plasma treatment process and the thermal treatment process, a gas mixture that includes oxygen gas or nitrogen gas may be used.

Figure 6:
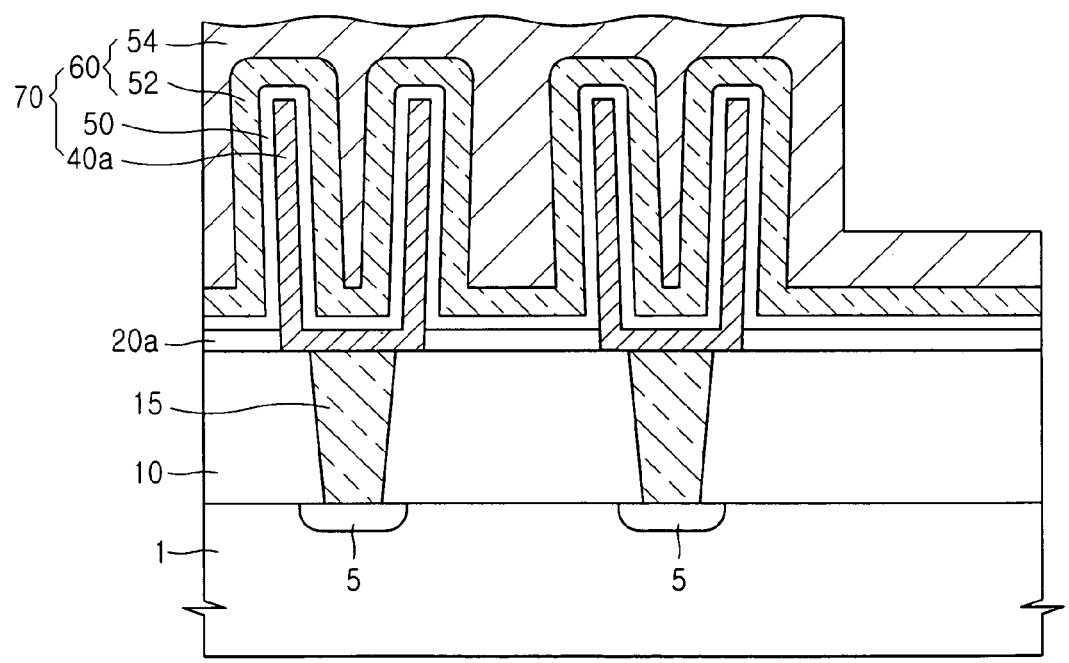

Referring to FIG. 6, a top electrode 60 is formed on the dielectric layer 50 to obtain capacitors 70. The top electrode 60 may be formed in a dual layer structure including a doped poly-$Si_{1-x}Ge_x$ layer 52 and a second doped polysilicon layer 54 that is epitaxially deposited on the doped poly-$Si_{1-x}Ge_x$ layer 52.

An atomic content ratio of germanium (Ge) of the doped poly-$Si_{1-x}Ge_x$ layer 52 expressed as 'x' is equal to or greater than approximately 0.1 and equal to or less than approximately 0.9 (i.e., $0.1 \leq x \leq 0.9$). Preferably, the range of 'x' is determined in consideration of a dopant concentration, so that the value of 'x' is a linear function value that does not allow formation of a depletion layer.

The doped poly-$Si_{1-x}Ge_x$ layer 52 may be formed by a LPCVD method using $SiH_4$ gas and $GeH_4$ gas at a temperature of approximately 400° C. to approximately 550° C. Also, the doped poly-$Si_{1-x}Ge_x$ layer 52 may be doped with an N-type impurity or a P-type impurity selected from a group consisting of $PH_3$, $AsH_3$, $BCl_3$, and $B_2H_6$. At this time, a pressure can be maintained in a range from approximately 0.01 torr to approximately 10 torr. If the formation of the doped poly-$Si_{1-x}Ge_x$ layer 52 is carried out at a temperature less than approximately 400° C., the dopant is not sufficiently activated, thereby increasing resistivity. If the temperature is greater than approximately 550° C., the leakage current may increase.

According to empirical data, the dopant activation and the formation of the doped poly-$Si_{1-x}Ge_x$ layer 52 occur simultaneously at a temperature ranging from approximately 400° C. to approximately 550° C. Since the melting point of $Si_{1-x}Ge_x$ is lower than that of silicon, those physical characteristics such as deposition, crystallization, grain growth, and dopant activation are more likely to be exhibited at a temperature that is less than the melting point of the silicon. In consideration of the resistivity and leakage current, the doped poly-$Si_{1-x}Ge_x$ layer 52 is preferably formed at a temperature between approximately 400° C. and approximately 520° C.

Subsequently, the second doped polysilicon layer 54 is formed on the doped poly-$Si_{1-x}Ge_x$ layer 52. Particularly, the second doped polysilicon layer 54 is epitaxially deposited on the doped poly-$Si_{1-x}Ge_x$ layer 52 and is preferably formed in-situ with the same apparatus used to form the doped poly-$Si_{1-x}Ge_x$ layer 52. The in-situ deposition of the second doped polysilicon layer 54 does not generally need a vacuum break, and thus, a native oxide layer is not grown on the doped poly-$Si_{1-x}Ge_x$ layer 52, thereby enabling silicon growth on the doped poly-$Si_{1-x}Ge_x$ layer 52 even without a nucleation procedure. As a result of this enabled silicon growth, the second doped polysilicon layer 54 can be formed at the same temperature for forming the doped poly-$Si_{1-x}Ge_x$ layer 52 (i.e., in a range of temperatures between 400° C. and approximately 550° C.).

According to empirical data, the formation of the second doped polysilicon layer 54 and the dopant activation can take place simultaneously since the second doped polysilicon layer 54 forms a lattice match with the doped poly-$Si_{1-x}Ge_x$ layer 52 when the second doped polysilicon layer 54 is epitaxially deposited on the doped poly-$Si_{1-x}Ge_x$ layer 52. Therefore, compared to a conventional method of forming a doped polysilicon layer as an electrode at above approximately 600° C., the doped polysilicon layer 54 may be formed at a lower temperature so a subsequent high-temperature thermal annealing process is not necessary.

For instance, the doped poly-$Si_{1-x}Ge_x$ layer 52 may be formed through the aforementioned LPCVD method at a temperature of approximately 400° C. to approximately 550° C. and a pressure of approximately 0.01 torr to approximately 10 torr using $SiH_4$ gas and $GeH_4$ gas and a dopant selected from the group consisting of $PH_3$, $AsH_3$, $BCl_3$, and $B_2H_6$. While the doped poly-$Si_{1-x}Ge_x$ layer 52 is formed under the above described recipe, the $GeH_4$ gas supply is stopped to form the second doped polysilicon layer 54 in-situ using only the $SiH_4$ gas.

The doped poly-$Si_{1-x}Ge_x$ layer 52 is formed in a thickness ranging from approximately 100 Å to approximately 500 Å and the second doped polysilicon layer 54 is formed in a thickness ranging from approximately 1,000 Å to approximately 1,500 Å. It is also possible to form the doped poly-$Si_{1-x}Ge_x$ layer 52 in a thickness ranging from approximately 1,000 Å to approximately 1,500 Å and the second doped polysilicon layer 54 in a thickness ranging from approximately 100 Å to approximately 150 Å. FIG. 6 shows the formerly described case of the thickness ranges for the doped poly-$Si_{1-x}Ge_x$ layer 52 and the second doped polysilicon layer 54.

As described above, the capacitors 70 including the bottom electrode 40A, the dielectric layer 50, and the top electrode 60 can each be formed at a temperature that is lower than approximately 550° C. Therefore, the leakage current characteristics of the capacitor 70 may be improved.

Figure 7:
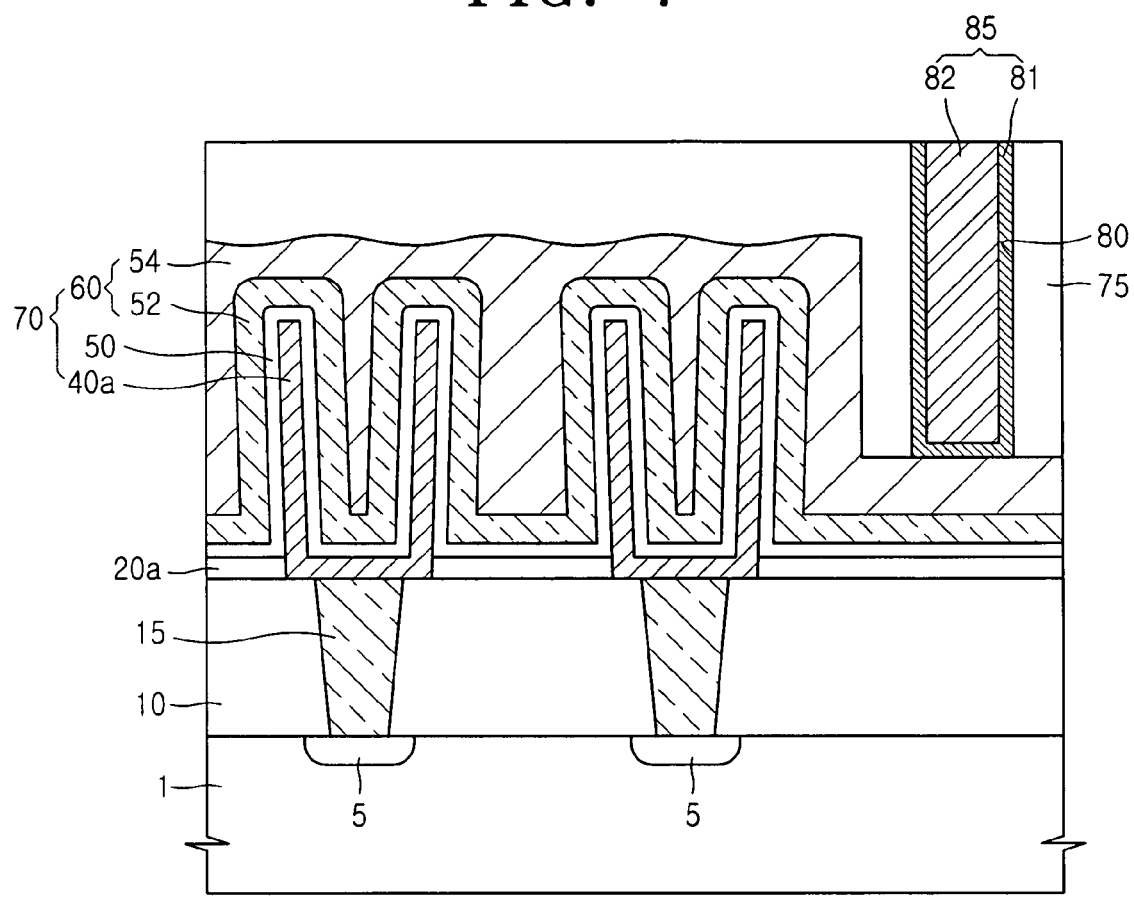

Referring to FIG. 7, an inter-layer insulation layer 75 is formed on the capacitors 70. The inter-layer insulation layer 75 is etched to form a contact hole 80 that exposes a surface of the top electrode 60. The contact hole 80 is then filled with a metal layer or metal layers to obtain a second contact plug 85. For example, as illustrated in FIG. 7, a barrier metal layer 81 may be formed on inner walls of the contact hole 80. Next, a tungsten layer 82 is formed on the barrier metal layer 81 to fill the contact hole 80, thereby forming the second contact plug 85. The barrier metal layer 81 may itself consist of several stacks of layers, such as a multi-stack Ti/TiN layer.

Figure 8:
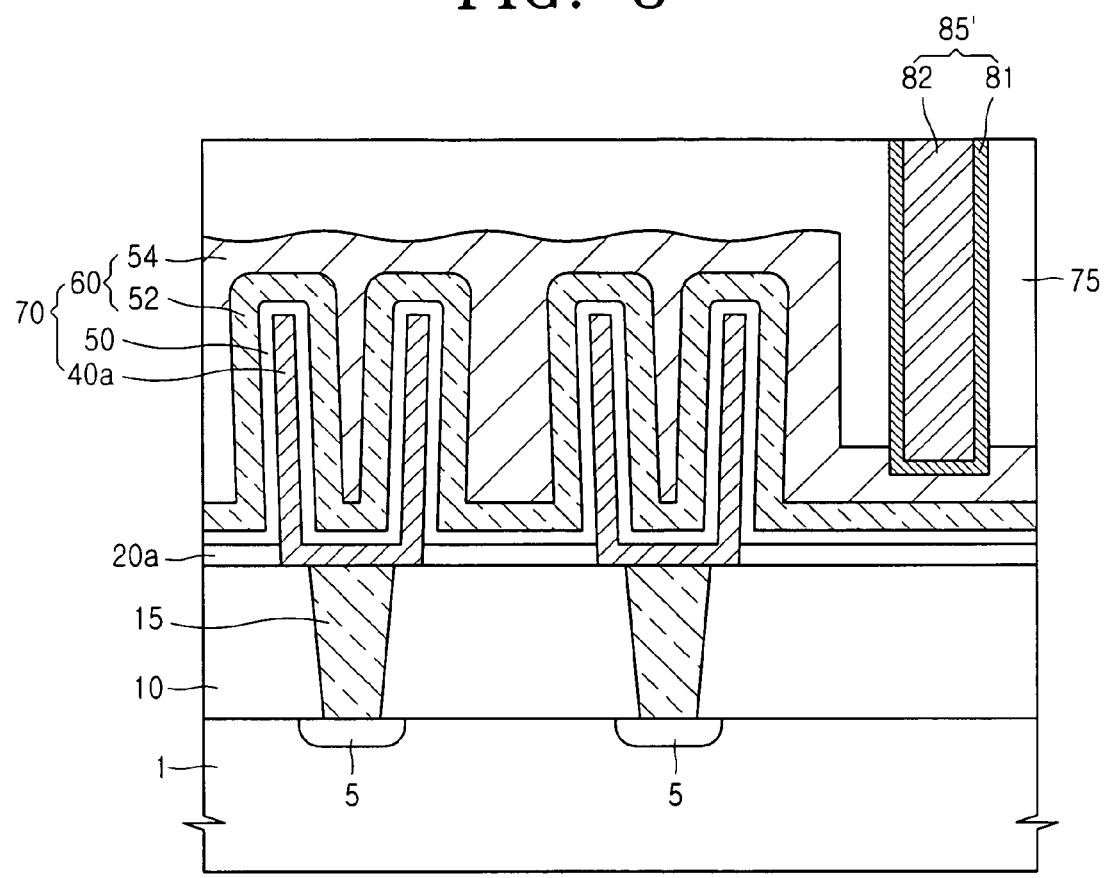
FIG. 8 is a sectional diagram illustrating a semiconductor device manufactured according to other embodiments of the invention.
Figure 9:
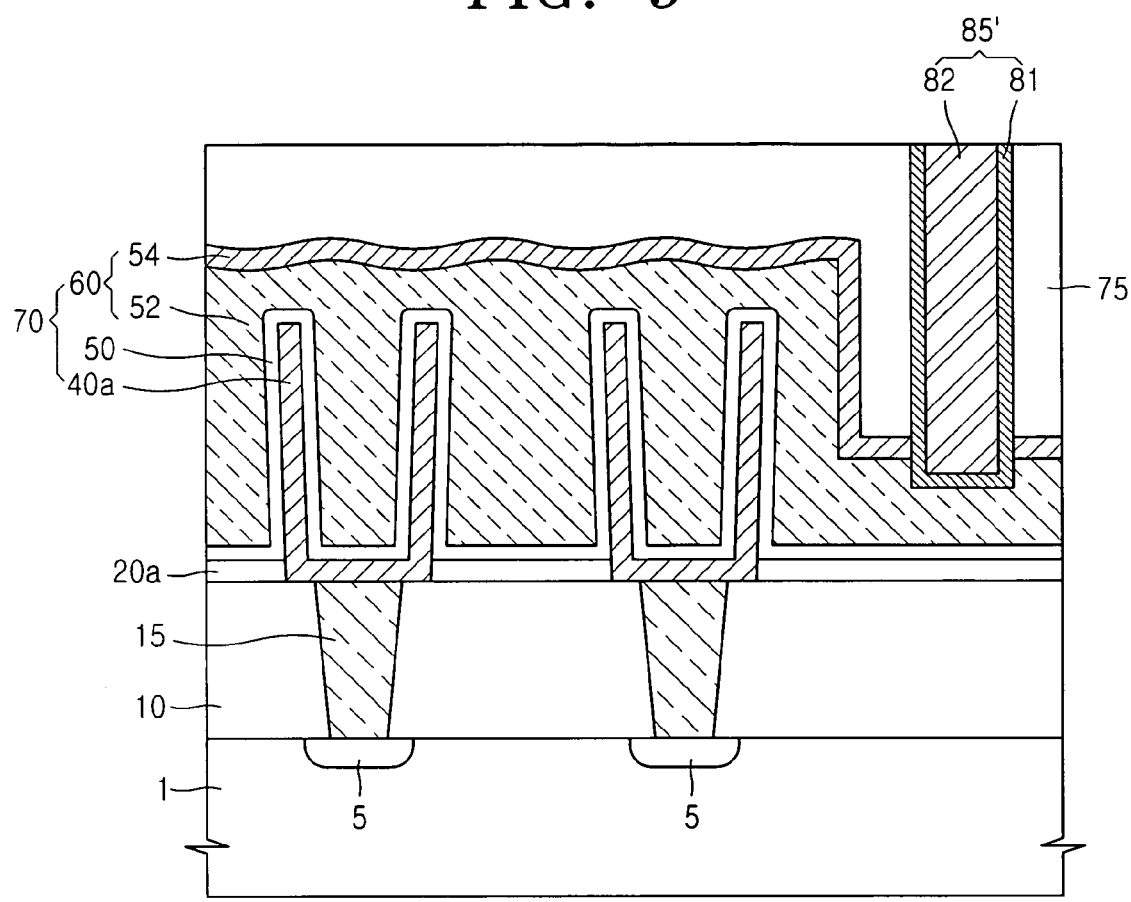
FIG. 9 is a sectional diagram illustrating a semiconductor device manufactured according to more embodiments of the invention.

FIG. 8 is a sectional diagram illustrating a semiconductor device manufactured according to other embodiments of the invention. FIG. 9 is a sectional diagram illustrating a semiconductor device manufactured according to more embodiments of the invention.

The embodiments illustrated in FIGS. 8 and 9 are modifications of the embodiments shown in FIGS. 1-7. Therefore, where features of the embodiments shown in FIGS. 8 and 9 are shared by the embodiments illustrated in FIGS. 1-7, the same reference numerals are used to describe these common features, and an unnecessarily duplicative description of the formation of these elements is omitted.

As shown in FIG. 8, a second contact plug 85' may be formed such that the second contact plug 85' extends beyond an upper surface of the second doped polysilicon layer 54. FIG. 8 illustrates the case where the doped poly-$Si_{1-x}Ge_x$ layer 52 is formed to a thickness between approximately 100 Å to approximately 500 Å while the second doped polysilicon layer 54 is formed to a thickness between approximately 1,000 Å to approximately 1,500 Å. In this case, the extension depth of the second contact plug 85' should not exceed the thickness of the second doped polysilicon layer 54.

FIG. 9 illustrates the case where the doped poly-$Si_{1-x}Ge_x$ layer 52 is formed to a thickness between approximately 1,000 Å to approximately 1,500 Å while the second doped polysilicon layer 54 is formed to a thickness between approximately 100 Å to approximately 500 Å. In this case, the extension depth of the second contact plug 85' may exceed the thickness of the second doped polysilicon layer 54.

According to empirical data which will be described in detail later, an interface between a metal and a doped poly-$Si_{1-x}Ge_x$ layer has a higher resistance level than that of an interface between a metal and a doped polysilicon layer used as a top electrode. An insufficient concentration of carriers inside the doped poly-$Si_{1-x}Ge_x$ layer or an impairment of metal silicide formation during forming a metal contact due to germanium (Ge) of the doped poly-$Si_{1-x}Ge_x$ layer may be a cause for the above result.

However, in the embodiments illustrated in FIGS. 7-9, a contact between the second contact plug 85 or 85' and the top electrode 60 includes an interface between the second contact plug 85 or 85' and the second doped polysilicon layer 54. Therefore, it is possible to decrease a contact resistance level compared to the case of a direct contact made between the second contact plug 85 or 85' and the doped poly-$Si_{1-x}Ge_x$ layer 52. This reduced contact resistance makes it possible to secure low and stable metal contact resistance.

Additionally, the bottom electrodes 40A of the capacitors 70 may include a metal layer. For instance, referring to FIGS. 2 and 3, a metal layer selected from a group consisting of TiN, WN, TaN, Cu, and W may alternatively be formed on the mold oxide patterns 30A through a CVD method, an ALD method, or a metal-organic (MO) CVD method. Thereafter, the metal layer is planarized. In addition to the above mentioned materials, noble metals such as Pt, Ir, Ru, Rh, Os, and Pd, oxides thereof, or a multiple metal layer structure such as TiN/W, TiN/TaN or WN/W may be used for the metal layer. By using the metal layer as the bottom layer for the bottom electrodes 40A, materials such as $HfO_2/Al_2O_3$, $SrTiO_3$ and $(Ba, Sr)TiO_3$ can be used as the dielectric layer 50 in addition to $HfO_2$, $Al_2O_3$, $Al_2O_3/HfO_2$.

Figure 10:
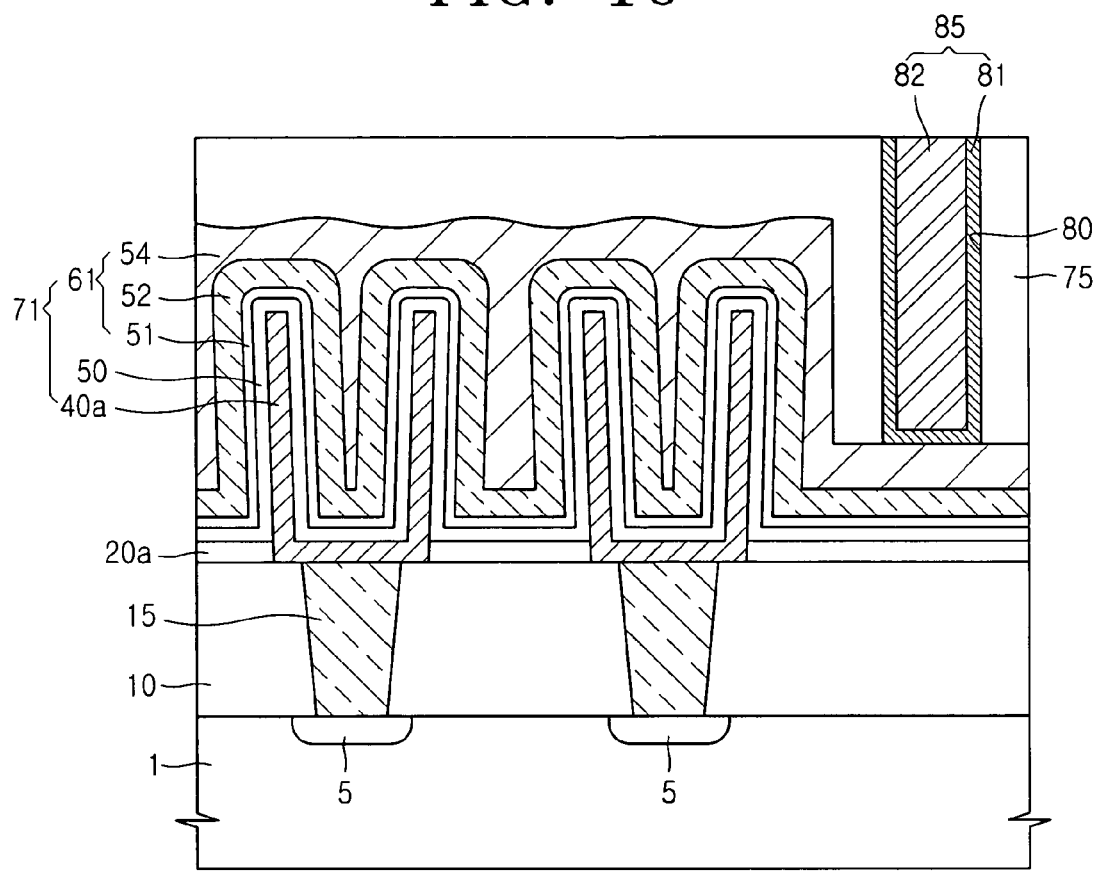
FIG. 10 is a sectional diagram illustrating a semiconductor device manufactured according to different embodiments of the invention.

FIG. 10 is a sectional diagram illustrating a semiconductor device manufactured according to different embodiments of the invention. It should be noted that the same reference numerals are used for the elements that were already described above with reference to other embodiments and therefore, a detailed description of such elements is omitted.

The embodiments illustrated by FIG. 10 include a capacitor with a top electrode formed in a triple layer structure of a TiN layer, a doped poly-$Si_{1-x}Ge_x$ layer, and a doped polysilicon layer that is epitaxially deposited on the doped poly-$Si_{1-x}Ge_x$ layer.

To form the device illustrated in FIG. 10, the processes that were described with reference to FIGS. 1 through 5 are first performed. A TiN layer 51 is formed on the dielectric layer 50 by employing either a CVD method, an ALD method, or a MOCVD method. Instead of using TiN, a material selected from the group consisting of WE, TaN, Cu, Al, and W may be used. It is also possible to use a noble metal selected from a group consisting of Pt, Ir, Ru, Rh, Os, and Pd, and oxides thereof. A metal stack layer structure such as TiN/W, TiN/TaN and WN/W can be used as well. The TiN layer 51 may be formed more effectively when the deposition temperature is lower than approximately 500° C.

Next, the processes that were described with reference to FIGS. 6 and 7 are performed. Referring to FIG. 10, capacitors 71 each including a top electrode 61 are formed on the dielectric layer 50. The top electrode 61 includes the TiN layer 51, a doped poly-$Si_{1-x}Ge_x$ layer 52 and a second doped polysilicon layer 54 that is epitaxially deposited on the doped poly-$Si_{1-x}Ge_x$ layer 52. Subsequent to the formation of the capacitors 71, a second contact plug 85 connected with the top electrode 61 is formed.

The bottom electrodes 40A of the capacitors 71 can include a doped polysilicon layer or a metal layer. Since the top electrode 61 includes a metal layer such as the TiN layer 51, if the bottom electrodes 40A are implemented with a doped polysilicon layer, MIS type capacitors are the result. If the bottom electrodes 40A are implemented with a metal layer, MIM capacitors are the result.

These embodiments of the invention suggest a method of forming a dual layer structure including the doped poly-$Si_{1-x}Ge_x$ layer 52 and the second doped polysilicon layer 54 which can be formed in-situ at a temperature lower than approximately 550° C. Also with using this suggested method, a triple layer structure including the TiN layer 51, the doped poly-$Si_{1-x}Ge_x$ layer 52, and the second doped polysilicon layer 54 is used as the top electrode 61 for MIM or MIS type capacitors. This triple layer structure of the top electrode 61 contributes to improvements in the leakage current characteristic and to the reliability of the dielectric layer 50.

To further describe the above embodiments of the invention, empirical data obtained from several experiments is presented below. Technologies that are well-known to those of ordinary skill in the art have not been described in detail, and the spirit and scope of the invention are not limited by these exemplary experiments.

In an exemplary experiment, using a typical LPCVD apparatus, a poly-$Si_{1-x}Ge_x$ layer was deposited at temperatures of approximately 450° C., 470° C., 490° C., and 520° C. while phosphorus was simultaneously doped on the poly-$Si_{1-x}Ge_x$ layer. At this time, $SiH_4$ and $GeH_4$ gases were used as source gases and the flow quantity of the $GeH_4$ gas was varied. The deposition of the poly-$Si_{1-x}Ge_x$ layer was carried out for approximately 4 minutes to approximately 5 minutes. The $GeH_4$ gas was diluted with hydrogen or nitrogen to approximately 10% by volume. Hereinafter, the diluted $GeH_4$ gas is expressed as '10% $GeH_4$.' The doping concentration of phosphorus was approximately $3 \times 10^{20}$ cm$^{-3}$, and a resulting N-type impurity doped poly-$Si_{1-x}Ge_x$ layer (hereinafter referred to as an N-type doped poly-$Si_{1-x}Ge_x$ layer) was not subjected to an additional thermal treatment process.

Figure 11:
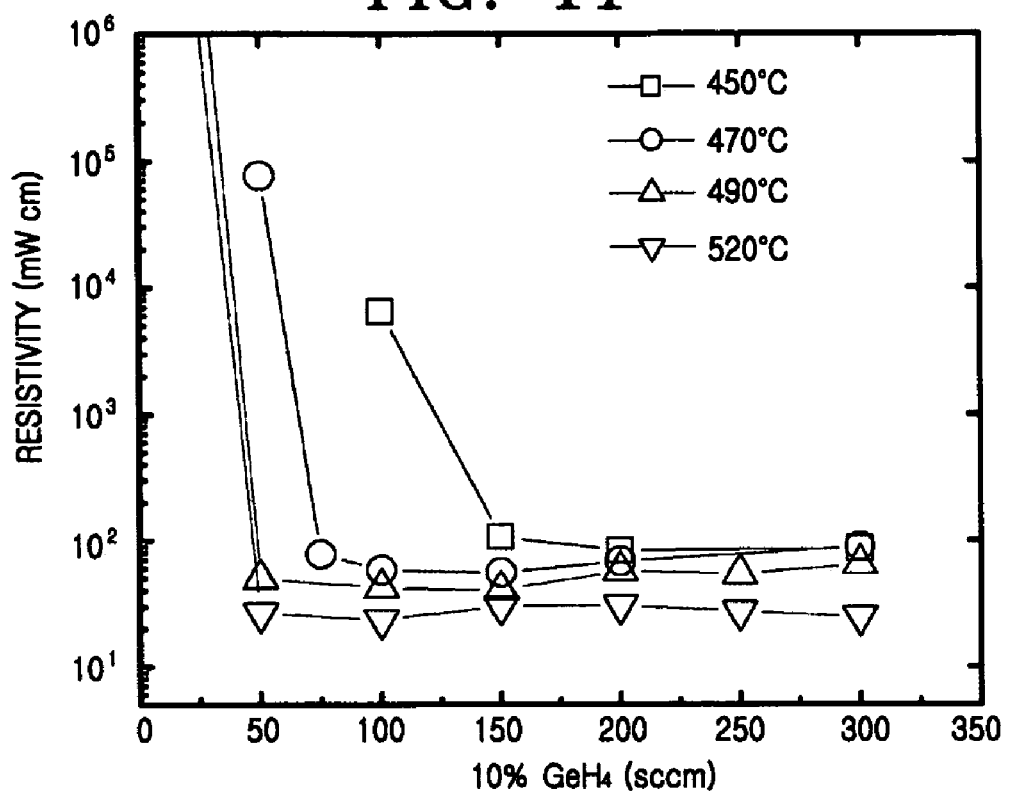
FIG. 11 is a graph illustrating the resistivity characteristic of an N-type doped poly-$Si_{1-x}Ge_x$ layer as a function of the flow quantity of 10% $GeH_4$ gas, wherein the N-type doped poly-$Si_{1-x}Ge_x$ layer is formed through a low pressure chemical vapor deposition (LPCVD) method according to some embodiments of the invention.

FIG. 11 is a graph illustrating the resistivity characteristic of an N-type doped poly-$Si_{1-x}Ge_x$ layer as a function of the flow quantity of 10% $GeH_4$ gas, wherein the N-type doped poly-$Si_{1-x}Ge_x$ layer is formed through a low pressure chemical vapor deposition (LPCVD) method according to some embodiments of the invention. In FIG. 11, the horizontal axis and the vertical axis represent a flow quantity of 10% $GeH_4$ gas and the resistivity, respectively.

As shown in FIG. 11, the resistivity of the N-type doped poly-$Si_{1-x}Ge_x$ layer decreases as the flow quantity of $GeH_4$ gas increases. It is apparent that a stable resistivity level can be secured at a low temperature of approximately 450° C. and based on this fact, it can be concluded that the deposition of the doped poly-$Si_{1-x}Ge_x$ layer and activation of the dopant, i.e., phosphorus, can take place simultaneously at such low temperature.

As described above, a stack structure including a doped poly-$Si_{1-x}Ge_x$ layer and a doped polysilicon layer as a top electrode of a capacitor may be implemented according to some embodiments of the invention.

In another exemplary experiment, using a typical LPCVD apparatus, approximately 300 Å of an N-type doped poly-$Si_{1-x}Ge_x$ layer was deposited at a temperature of approximately 520° C. and a pressure of approximately 0.45 torr. During the deposition of the doped poly-$Si_{1-x}Ge_x$ layer, approximately 150 sccm of $SiH_4$ gas, approximately 100 sccm of $GeH_4$ gas and approximately 100 sccm of $PH_3$ gas were provided. Also, approximately 150 sccm of $SiH_4$ gas and approximately 100 sccm of $PH_3$ gas were provided in-situ, thereby obtaining approximately 2,000 Å of an N-type doped polysilicon layer.

Figure 12:
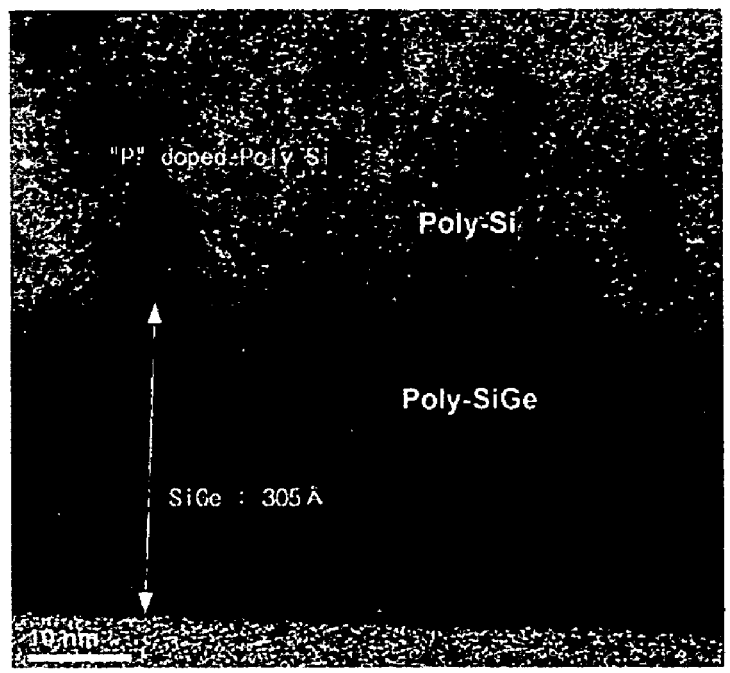
FIG. 12 is a sectional transmission electron microscopy (TEM) photograph illustrating a dual structure including a doped poly-$Si_{1-x}Ge_x$ layer and a doped polysilicon layer according to some embodiments of the invention.

FIG. 12 is a sectional transmission electron microscopy (TEM) photograph illustrating a dual structure including a doped poly-$Si_{1-x}Ge_x$ layer and a doped polysilicon layer according to some embodiments of the invention. FIG. 12 illustrates that the doped poly-$Si_{1-x}Ge_x$ layer and the doped polysilicon layer have a nearly complete crystallization structure and a lattice-matched structure. Also, the resistivity of the sample stack structure was measured at approximately 341 ohm/sq., lower than the resistivity of a single layer of doped poly-$Si_{1-x}Ge_x$, which is approximately 11347 ohm/sq. On the basis of this result, it can be concluded that the crystallization and the dopant activation of the doped poly-$Si_{1-x}Ge_x$ layer and the doped polysilicon layer simultaneously occurred at approximately 520° C.

Figure 13:
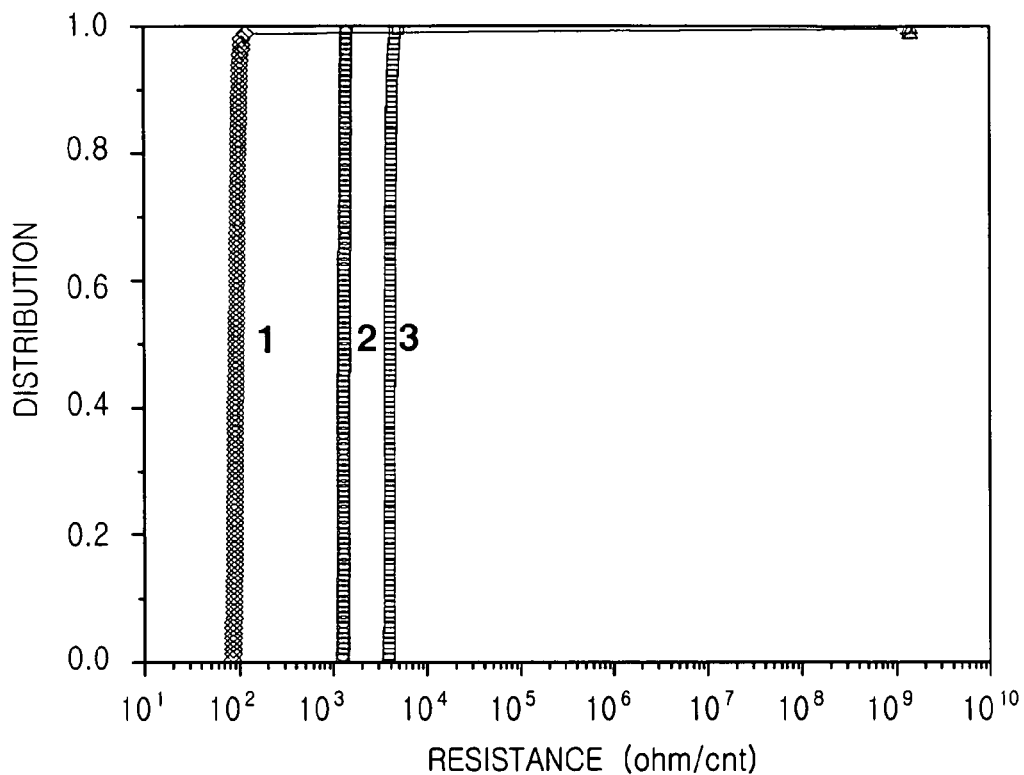
FIG. 13 is a graph that compares a contact resistance characteristic between an N-type doped poly-$Si_{1-x}Ge_x$ layer specifically doped with phosphorus and a stack layer of Ti/TiN with a contact resistance characteristic between an N-type doped polysilicon layer specifically doped with phosphorus and a stack layer of Ti/TiN according to some embodiments of the invention.

FIG. 13 is a graph that compares a contact resistance characteristic between an N-type doped poly-$Si_{1-x}Ge_x$ layer specifically doped with phosphorus and a stack layer of Ti/TiN with a contact resistance characteristic between an N-type doped polysilicon layer specifically doped with phosphorus and a stack layer of Ti/TiN according to some embodiments of the invention. Specifically, the N-type doped poly-$Si_{1-x}Ge_x$ layer is a phosphorus doped poly-$Si_{1-x}Ge_x$ layer and the barrier metal layer includes a Ti layer and a TiN layer.

More specifically, a first sample '1' was obtained by annealing the doped polysilicon layer at approximately 600° C. and then forming the stack structure of Ti/TiN at approximately 700° C. A concentration of phosphorus was approximately $3.4 \times 10^{20}$ cm$^{-3}$. A second sample '2' was obtained by forming the doped poly-$Si_{1-x}Ge_x$ layer at approximately 520° C. and then forming the stack structure of Ti/TiN at approximately 550° C. A concentration of phosphorus was approximately $2 \times 10^{20}$ cm$^{-3}$. Even if the stack structure of Ti/TiN is formed at approximately 700° C., a similar result can be obtained. A third sample '3' was obtained by forming the doped poly-$Si_{1-x}Ge_x$ layer at approximately 470° C. and then forming the stack structure of Ti/TiN at approximately 550° C. A concentration of phosphorus was approximately 5.3×

$10^{20}$ cm$^{-3}$. Even if the stack structure of Ti/TiN in the third sample '3' is formed at approximately 700° C., a similar result can be obtained.

As shown by FIG. 13, the contact resistance level between the doped polysilicon layer and the stack structure of Ti/TiN is lower than that between the doped poly-Si$_{1-x}$Ge$_x$ layer and the stack structure of Ti/TiN by approximately 10-fold regardless of the doping concentration of phosphorus and the deposition temperature of Ti/TiN. An interface between a metal (e.g., the stack structure of Ti/TiN) and the doped poly-Si$_{1-x}$Ge$_x$ layer has a higher resistance level than an interface between a metal (e.g., the stack structure of Ti/TiN) and the doped polysilicon layer. An insufficient concentration of carriers within the doped poly-Si$_{1-x}$Ge$_x$ layer or an impairment of metal silicide formation during forming a metal contact due to germanium (Ge) of the doped poly-Si$_{1-x}$Ge$_x$ layer may be a cause for the above result.

According to some embodiments of the invention, the capacitor of the semiconductor device includes the doped polysilicon layer contacting a metal contact plug (e.g., the second contact plug). Therefore, it is possible to decrease the contact resistance compared with the case that the doped poly-Si$_{1-x}$Ge$_x$ layer makes a contact with the metal contact plug. The reduced contact resistance can provide another effect of providing low and stable metal contact resistance.

Figure 14:
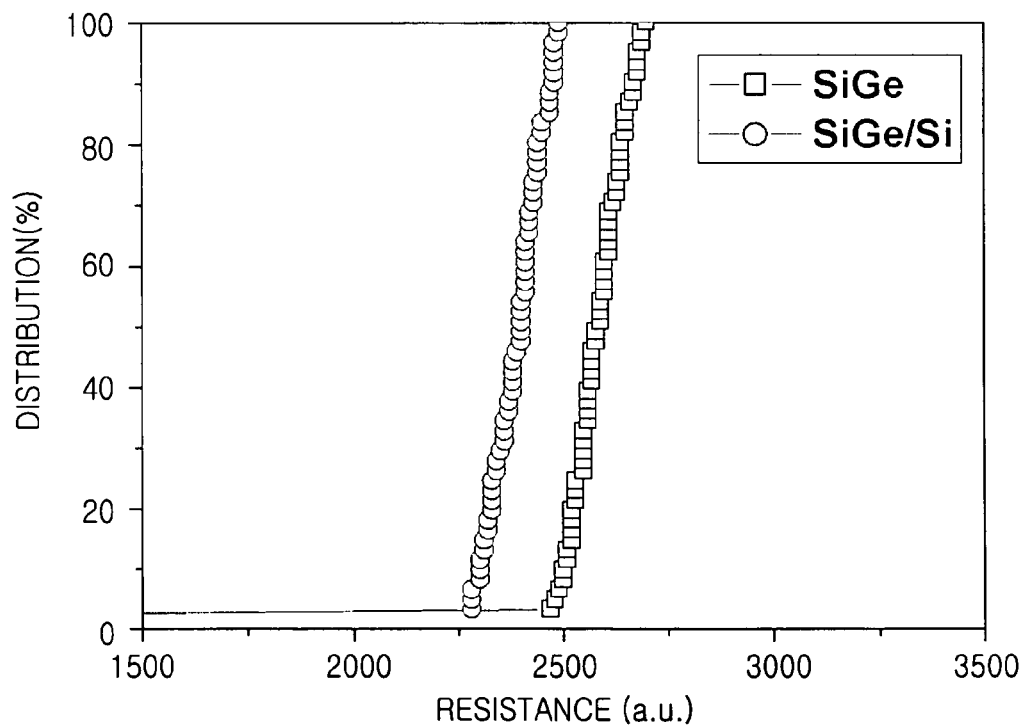
FIG. 14 is a graph that compares a contact resistance characteristic between an N-type doped poly-$Si_{1-x}Ge_x$ layer specifically doped with phosphorus and a stack layer of Ti/TiN with a contact resistance characteristic between a dual layer structure of an N-type doped poly-$Si_{1-x}Ge_x$ layer and an N-type doped polysilicon layer both specifically doped with phosphorus and a stack layer of Ti/TiN according to some embodiments of the invention.

FIG. 14 is a graph that compares a contact resistance characteristic between an N-type doped poly-Si$_{1-x}$Ge$_x$ layer specifically doped with phosphorus and a stack layer of Ti/TiN with a contact resistance characteristic between a dual layer structure of an N-type doped poly-Si$_{1-x}$Ge$_x$ layer and an N-type doped polysilicon layer both specifically doped with phosphorus and a stack layer of Ti/TiN according to some embodiments of the invention. Specifically, in this experiment, the N-type doped poly-Si$_{1-x}$Ge$_x$ layer and the N-type doped polysilicon layer were a phosphorus doped poly-Si$_{1-x}$Ge$_x$ layer and a phosphorus doped polysilicon layer, respectively. Also, a Ti/TiN stack layer structure was formed as the barrier metal layer.

In FIG. 14, the SiGe trace (shown with squares, □) illustrates a contact resistance characteristic between a single layer of the N-type doped poly-Si$_{1-x}$Ge$_x$ layer used as a top electrode and the metal contact plug (e.g., the barrier metal layer of Ti/TiN), while the SiGe/Si trace (shown with circles, ○) illustrates a contact resistance characteristic between a dual layer structure of the N-type doped poly-Si$_{1-x}$Ge$_x$ layer and the N-type doped polysilicon layer epitaxially deposited on the N-type doped poly-Si$_{1-x}$Ge$_x$ layer and the metal contact plug (e.g., the barrier metal layer of Ti/TiN). In this experiment, the dual layer structure of the N-type doped poly-Si$_{1-x}$Ge$_x$ layer and the N-type doped polysilicon layer was used as a top electrode.

As shown in FIG. 14, when the dual layer structure is used as the top electrode, the contact resistance level between the dual layer structure and the metal contact plug decreases. This result can be predicted from FIG. 13. As described in FIG. 13, the contact resistance level between the doped polysilicon layer and the barrier metal layer of Ti/TiN is lower than that between the doped poly-Si$_{1-x}$Ge$_x$ layer and the barrier metal layer of Ti/TiN. Therefore, it can be expected that, by using the dual layer structure of the doped poly-Si$_{1-x}$Ge$_x$ layer and the doped polysilicon layer that is epitaxially deposited on the doped polysilicon layer, the contact resistance between the dual layer structure and the metal contact plug is lower than the contact resistance between the doped poly-Si$_{1-x}$Ge$_x$ layer used as the top electrode and the metal contact plug.

According to certain embodiments of the present invention, the top electrode of the capacitor of the semiconductor device includes a dual layer structure of the doped poly-Si$_{1-x}$Ge$_x$ layer and the doped polysilicon layer epitaxially deposited on the doped poly-Si$_{1-x}$Ge$_x$ layer. On the basis of the empirical data, it is verified that the doped poly-Si$_{1-x}$Ge$_x$ layer can be formed at a temperature lower than approximately 550° C. In the case of forming the doped polysilicon layer on the doped poly-Si$_{1-x}$Ge$_x$ layer via epitaxial deposition, the doped polysilicon layer can also be formed at a temperature lower than approximately 550° C.

Thus, compared to the conventional capacitor process that generally requires forming the doped polysilicon layer at above approximately 600° C., the method according to embodiments of the invention may reduce a leakage current characteristic of the capacitor.

Also, the contact resistance characteristic between the stack structure of the doped poly-Si$_{1-x}$Ge$_x$ layer and the doped polysilicon layer and the metal contact plug is lower than that between the doped poly-Si$_{1-x}$Ge$_x$ layer and the metal contact plug. Accordingly, semiconductor devices having an improved capacitor leakage current characteristic and reduced contact resistance level may be fabricated.

The invention may be practiced in many ways. What follows are exemplary, non-limiting descriptions of some embodiments of the invention.

According to some embodiments of the invention, a capacitor in a semiconductor device includes a bottom electrode, a dielectric layer formed on the bottom electrode, a top electrode formed on the dielectric layer, and a contact plug including a metal and connected with the top electrode, wherein the top electrode includes a doped poly-Si$_{1-x}$Ge$_x$ layer and a doped polysilicon layer epitaxially deposited on the doped poly-Si$_{1-x}$Ge$_x$ layer and wherein the contact plug makes a contact with the doped polysilicon layer.

The bottom electrode may include a doped polysilicon layer, and the dielectric layer may include a material selected from a group consisting of HfO$_2$, Al$_2$O$_3$ and a combination thereof. The top electrode may further include a TiN layer between the dielectric layer and the doped poly-Si$_{1-x}$Ge$_x$.

The doped poly-Si$_{1-x}$Ge$_x$ layer may have an atomic content ratio of Ge, which is expressed as x, in a range between approximately 0.1 and approximately 0.9, inclusively. At this time, the doped poly-Si$_{1-x}$Ge$_x$ layer may have a thickness ranging from approximately 100 Å to approximately 500 Å and the doped polysilicon layer of the top electrode may have a thickness ranging from approximately 1,000 Å to approximately 1,500 Å. Alternatively, the doped poly-Si$_{1-x}$Ge$_x$ layer may have a thickness ranging from approximately 1,000 Å to approximately 1,500 Å and the doped polysilicon layer of the top electrode may have a thickness ranging from approximately 100 Å to approximately 500 Å.

The contact plug may extend to an inner side of the doped polysilicon layer of the top electrode. The contact plug may extend to a depth that does not exceed a thickness of the doped polysilicon layer of the top electrode. The contact plug may possibly extend to a depth that exceeds a thickness of the doped polysilicon layer of the top electrode.

According to some embodiments of the invention, a method of fabricating a semiconductor device includes forming a capacitor having a bottom electrode, a dielectric layer formed on the bottom electrode, and a top electrode formed on the dielectric layer; and connecting a contact plug including a metal with the top electrode, wherein the top electrode is obtained by forming a doped poly-Si$_{1-x}$Ge$_x$ layer and then a doped polysilicon layer on the doped poly-Si$_{1-x}$Ge$_x$ layer via epitaxial deposition and the contact plug makes a contact with the doped polysilicon layer.

The top electrode may be formed at a temperature ranging from approximately 400° C. to approximately 550° C. so that the formation of the top electrode and dopant activation can take place simultaneously.

The doped poly-$Si_{1-x}Ge_x$ layer may have an atomic content ratio of Ge, which is expressed as x, in a range between approximately 0.1 and approximately 0.9, inclusive.

The doped poly-$Si_{1-x}Ge_x$ layer may have a thickness ranging from approximately 100 Å to approximately 500 Å and the doped polysilicon layer of the top electrode may have a thickness ranging from approximately 1,000 Å to approximately 1,500 Å.

Alternatively, the doped poly-$Si_{1-x}Ge_x$ layer may have a thickness ranging from approximately 1,000 Å to approximately 1,500 Å and the doped polysilicon layer of the top electrode may have a thickness ranging from approximately 100 Å to approximately 500 Å.

The doped poly-$Si_{1-x}Ge_x$ layer may be formed at a temperature ranging from approximately 400° C. to approximately 550° C. via LPCVD (low pressure chemical vapor deposition) method using $SiH_4$ and $GeH_4$ gases and a dopant selected from a group consisting of $PH_3$, $AsH_3$, $BCl_3$, and $B_2H_6$. The doped polysilicon layer of the top electrode may be formed at a temperature ranging from approximately 400° C. to approximately 550° C. via LPCVD (low pressure chemical vapor deposition) method using $SiH_4$ gas and a dopant selected from a group consisting of $PH_3$, $AsH_3$, $BCl_3$, and $B_2H_6$.

The doped polysilicon layer of the top electrode may be formed in-situ along with the doped poly-$Si_{1-x}Ge_x$ layer.

According to some embodiments of the invention, the top electrode of a capacitor in a semiconductor device includes a dual layer structure having a doped poly-$Si_{1-x}Ge_x$ layer and a doped polysilicon layer that is epitaxially deposited on the doped poly-$Si_{1-x}Ge_x$. The doped poly-$Si_{1-x}Ge_x$ layer can be formed at a temperature lower than approximately 550° C.

When the doped polysilicon layer is formed on the doped poly-$Si_{1-x}Ge_x$ layer via epitaxial deposition, the doped polysilicon layer may also be formed at a temperature lower than approximately 550° C. Hence, compared with the conventional capacitor process that generally requires forming the doped polysilicon layer at above approximately 600° C., the proposed capacitor process may reduce a leakage current characteristic of the capacitor.

Also, the contact resistance characteristic between the stack structure of the doped poly-$Si_{1-x}Ge_x$ layer and the doped polysilicon layer and the metal contact plug may be lower than the contact resistance between the doped poly-$Si_{1-x}Ge_x$ layer and the metal contact plug. Accordingly, such semiconductor devices with the improved capacitor leakage current characteristic and reduced contact resistance level can be fabricated.

While the invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A method of fabricating a capacitor for a semiconductor device, the method comprising:
   forming a bottom electrode;
   forming a dielectric layer on the bottom electrode;
   forming a doped poly-$Si_{1-x}Ge_x$ layer on the dielectric layer;
   epitaxially depositing a first doped polysilicon layer on the doped poly-$Si_{1-x}Ge_x$ layer, the doped poly-$Si_{1-x}Ge_x$ layer and the first doped polysilicon layer included in a top electrode of the capacitor; and
   forming a contact plug that is physically connected to the first doped polysilicon layer, the contact plug including a metal layer.

2. The method of claim 1, wherein forming the bottom electrode comprises depositing a second doped polysilicon layer.

3. The method of claim 2, wherein forming the dielectric layer comprises depositing a material selected from the group consisting of $HfO_2$, $Al_2O_3$, and a combination of $HfO_2$ and $Al_2O_3$.

4. The method of claim 1, further comprising, before forming the doped poly-$Si_{1-x}Ge_x$ layer, depositing a TiN layer on the dielectric layer.

5. The method of claim 1, wherein forming the doped poly-$Si_{1-x}Ge_x$ layer comprises activating the dopant concurrently with forming the doped poly-$Si_{1-x}Ge_x$ layer, wherein forming the doped poly-$Si_{1-x}Ge_x$ layer and activating the dopant is performed at a temperature ranging from approximately 400° C. to approximately 550° C.

6. The method of claim 1, wherein forming the doped poly-$Si_{1-x}Ge_x$ layer comprises forming the doped poly-$Si_{1-x}Ge_x$ layer so that $0.1 \leq x \leq 0.9$.

7. The method of claim 6, wherein the doped poly-$Si_{1-x}Ge_x$ layer has a thickness ranging from approximately 100 Å to approximately 500 Å and the first doped polysilicon layer has a thickness ranging from approximately 1,000 Å to approximately 1,500 Å.

8. The method of claim 7, wherein forming the doped poly-$Si_{1-x}Ge_x$ layer comprises Low Pressure Chemical Vapor Deposition (LPCVD) at a temperature ranging from approximately 400° C. to approximately 550° C. using $SiH_4$ and $GeH_4$ gases and a dopant selected from a group consisting of $PH_3$, $AsH_3$, $BCl_3$, and $B_2H_6$.

9. The method of claim 8, wherein epitaxially depositing the first doped polysilicon layer comprises LPCVD at a temperature ranging from approximately 400° C. to approximately 550° C. using $SiH_4$ gas and a dopant selected from a group consisting of $PH_3$, $AsH_3$, $BCl_3$, and $B_2H_6$.

10. The method of claim 6, wherein the doped poly-$Si_{1-x}Ge_x$ layer has a thickness ranging from approximately 1,000 Å to approximately 1,500 Å and the first doped polysilicon layer has a thickness ranging from approximately 100 Å to approximately 500 Å.

11. The method of claim 1, wherein epitaxially depositing the first doped polysilicon layer is performed in-situ after forming the doped poly-$Si_{1-x}Ge_x$ layer.

12. The method of claim 1, further comprising forming a silicon nitride layer between the bottom electrode and the dielectric layer.

13. The method of claim 1, wherein a thickness of the top electrode ranges from approximately 1,100 Å to approximately 2,000 Å.

14. The method of claim 1, wherein epitaxially depositing the first doped polysilicon layer comprises activating the dopant concurrently with forming the first doped polysilicon layer, wherein epitaxially depositing the first doped polysilicon layer and activating the dopant is performed at a temperature ranging from approximately 400° C. to approximately 550° C.

15. A method of fabricating a capacitor for a semiconductor device, the method comprising:
   forming a bottom electrode;
   forming a dielectric layer on the bottom electrode;
   forming a doped poly-$Si_{1-x}Ge_x$ layer on the dielectric layer;
   epitaxially depositing a first doped polysilicon layer on the doped poly-$Si_{1-x}Ge_x$ layer, the doped poly-$Si_{1-x}Ge_x$ layer and the first doped polysilicon layer included in a top electrode of the capacitor; and
   forming a contact plug that is physically connected to the first doped polysilicon layer, the contact plug including a metal layer, wherein forming the contact plug comprises:
   etching the first doped polysilicon layer to form a trench; and
   filling the trench with the contact plug.

16. The method of claim 15, wherein etching the first doped polysilicon layer comprises etching the first doped polysilicon layer so that the trench does not extend through a thickness of the first doped polysilicon layer.

17. The method of claim 15, wherein etching the first doped polysilicon layer comprises etching the first doped polysilicon layer so that the trench extends through a thickness of the first doped polysilicon layer.

* * * * *